(12) United States Patent
Jung et al.

(10) Patent No.: US 7,105,900 B2
(45) Date of Patent: Sep. 12, 2006

(54) REDUCED FLOATING BODY EFFECT STATIC RANDOM ACCESS MEMORY CELLS AND METHODS FOR FABRICATING THE SAME

(75) Inventors: Mu-Kyoung Jung, Seoul (KR); Young-Wug Kim, Seoul (KR); Hee-Sung Kang, Kyunggi-Do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/388,353

(22) Filed: Mar. 13, 2003

(65) Prior Publication Data
US 2004/0238892 A1 Dec. 2, 2004

(30) Foreign Application Priority Data
Mar. 19, 2002 (KR) ............... 2002-14705

(51) Int. Cl.
*H01L 29/76* (2006.01)
(52) U.S. Cl. ............... 257/379; 257/288; 257/E27.098; 257/E21.661; 257/E27.075
(58) Field of Classification Search ............... 257/347, 257/E27.098, E21.661, 350, 213, 257, E27.075, 257/288, 368, 379; 438/153, 154, 155, 381, 438/382, 383, 384, 385
See application file for complete search history.

(56) References Cited

U.S. PATENT DOCUMENTS

| 5,310,694 | A |   | 5/1994  | Houston |         |
|-----------|---|---|---------|---------|---------|
| 5,623,387 | A | * | 4/1997  | Li et al. | 361/56 |
| 5,654,241 | A | * | 8/1997  | Kakumu | 438/306 |
| 5,659,194 | A | * | 8/1997  | Iwamatsu et al. | 257/377 |
| 5,910,674 | A | * | 6/1999  | Kasai | 257/369 |
| 5,943,258 | A |   | 8/1999  | Houston et al. | 365/165 |
| 6,044,011 | A | * | 3/2000  | Marr et al. | 365/154 |
| 6,118,158 | A | * | 9/2000  | Kim | 257/369 |
| 6,133,608 | A |   | 10/2000 | Flaker et al. |  |
| 6,177,300 | B1 | * | 1/2001  | Houston et al. | 438/149 |
| 6,355,515 | B1 | * | 3/2002  | Moon et al. | 438/238 |
| 6,365,941 | B1 | * | 4/2002  | Rhee | 257/357 |
| 6,462,364 | B1 | * | 10/2002 | Horiuchi | 257/288 |
| 6,492,674 | B1 | * | 12/2002 | Komori | 257/306 |
| 6,593,630 | B1 | * | 7/2003  | Madan | 257/365 |
| 6,620,659 | B1 | * | 9/2003  | Emmma et al. | 438/154 |
| 6,624,459 | B1 |   | 9/2003  | Dachtera et al. |  |
| 6,646,296 | B1 | * | 11/2003 | Horiuchi | 257/288 |
| 6,743,692 | B1 | * | 6/2004  | Shiratake et al. | 438/381 |
| 6,815,281 | B1 | * | 11/2004 | Inoue et al. | 438/200 |
| 6,873,015 | B1 | * | 3/2005  | Bhattacharyya | 257/350 |
| 6,881,621 | B1 | * | 4/2005  | Choe et al. | 438/251 |

(Continued)

FOREIGN PATENT DOCUMENTS

GB          2 360 874 A          3/2001

(Continued)

*Primary Examiner*—Brook Kebede
*Assistant Examiner*—Khiem D. Nguyen
(74) *Attorney, Agent, or Firm*—Myers Bigel Sibley & Sajovec PA (57) ABSTRACT

An SRAM cell that may reduce or eliminate floating body effect when using a SOI and a method for fabricating the same are provided. A floating body of an access transistor of the SRAM is connected to a source region of a driver transistor, for example, through a body extension region extending from an active region. A silicide layer may be formed or a ground line contact may be over-etched to form a conductive contact plug that may provide a current path between the body exterior regions and the source region of the driver transistor.

18 Claims, 12 Drawing Sheets

U.S. PATENT DOCUMENTS

| | | | |
|---|---|---|---|
| 2002/0112137 A1* | 8/2002 | Houston | 711/200 |
| 2002/0127786 A1* | 9/2002 | Liaw | 438/153 |
| 2003/0002321 A1* | 1/2003 | Chang | 365/154 |
| 2003/0123279 A1* | 7/2003 | Aipperspach et al. | 365/154 |
| 2003/0132452 A1* | 7/2003 | Boriuchi | 257/192 |
| 2003/0141544 A1* | 7/2003 | Madan | 257/347 |
| 2003/0147275 A1* | 8/2003 | Chang | 365/174 |
| 2004/0067614 A1* | 4/2004 | Hidaka et al. | 438/200 |
| 2005/0280004 A1* | 12/2005 | Das et al. | 257/77 |

FOREIGN PATENT DOCUMENTS

| | | |
|---|---|---|
| JP | 20011352077 A | 12/2001 |
| KR | 10-2001-0039843 | 5/2001 |

* cited by examiner

REDUCED FLOATING BODY EFFECT STATIC RANDOM ACCESS MEMORY CELLS AND METHODS FOR FABRICATING THE SAME

RELATED APPLICATION

This application claims priority from Korean Patent Application No. 2002-14705, filed on Mar. 19, 2002, the contents of which are herein incorporated by reference in their entirety.

FIELD OF THE INVENTION

The present invention relates to static random access memory (SRAM) cells and methods for fabricating the same. More specifically, the present invention relates to SRAM cells on silicon on insulator (SOI) substrates, and methods for fabricating the same.

BACKGROUND OF THE INVENTION

Typically, an SRAM cell includes a pair of inverters with the outputs of the inverters cross-coupled to form a flip-flop. The typical SRAM cell includes four transistors for storing data and two transistors for selection of a particular cell. Unlike dynamic random access memory (DRAM) cells, because of the flip-flop feedback effect, SRAM cells typically enable storage of static data even without refresh operations.

Figure 1:
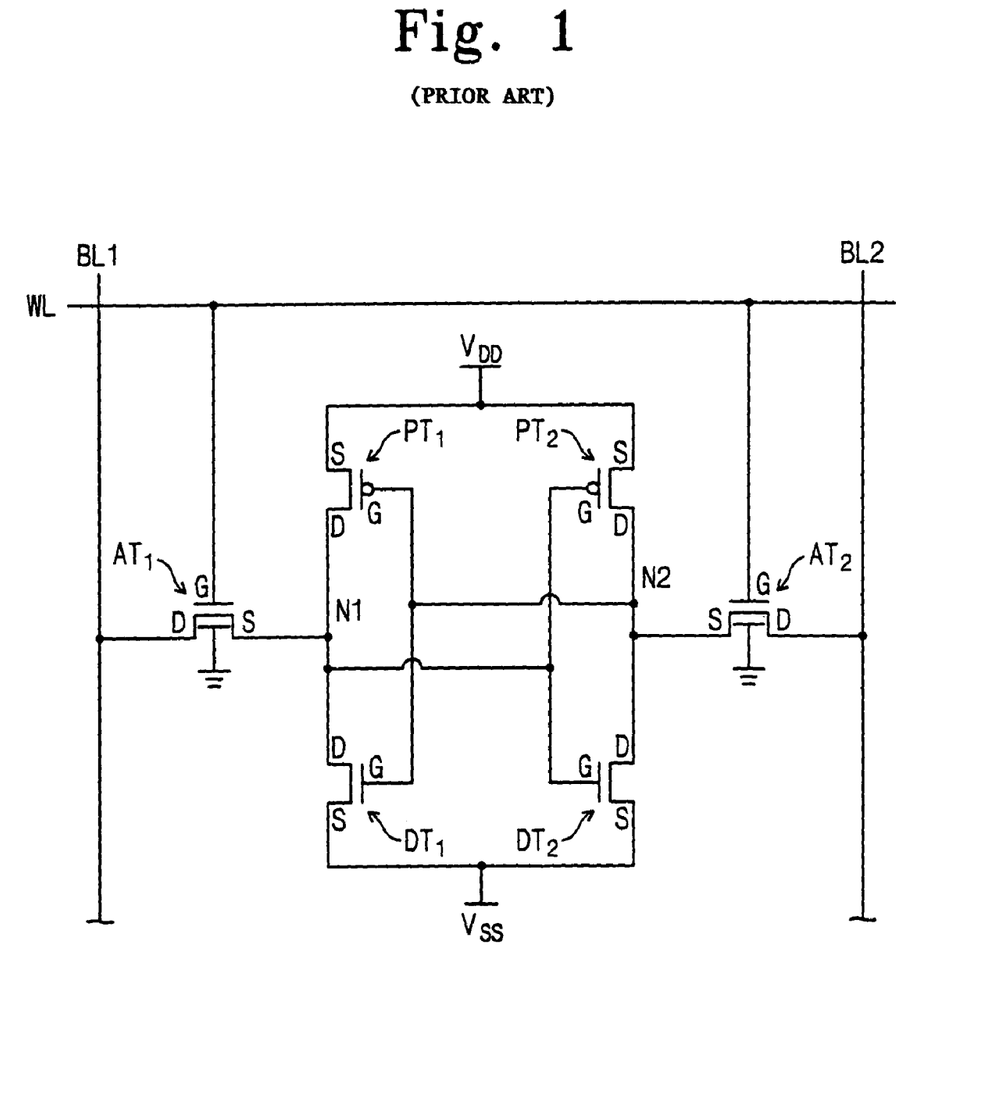
FIG. 1 is a circuit diagram of a conventioanl SRAM memory cell.

FIG. 1 is a circuit diagram of a conventional SRAM cell. Referring to FIG. 1, an SRAM cell includes a pair of access transistors $AT_1$ and $AT_2$, a pair of pull-up transistors $PT_1$ and $PT_2$, and a pair of driver transistors $DT_1$ and $DT_2$. The transistors $PT_1$ and $DT_1$ constitute a first inverter, and the transistors $PT_2$ and $DT_2$ constitute a second inverter. The first and second inverters are cross-coupled at nodes N1 and N2.

Source regions of the transistors $DT_1$ and $DT_2$ are coupled to a ground line Vss, and source regions of the transistors $PT_1$ and $PT_2$ are coupled to a power line Vdd. A drain region of the transistor $AT_1$ is coupled to a first bit line BL1, and a drain region of the transistor $AT_2$ is coupled to a second bit line BL2. Source regions of the transistors $AT_1$ and $AT_2$ are coupled to nodes N1 and N2, respectively. Gate electrodes of the transistors $AT_1$ and $AT_2$ are coupled to a common word line WL.

Figure 2:
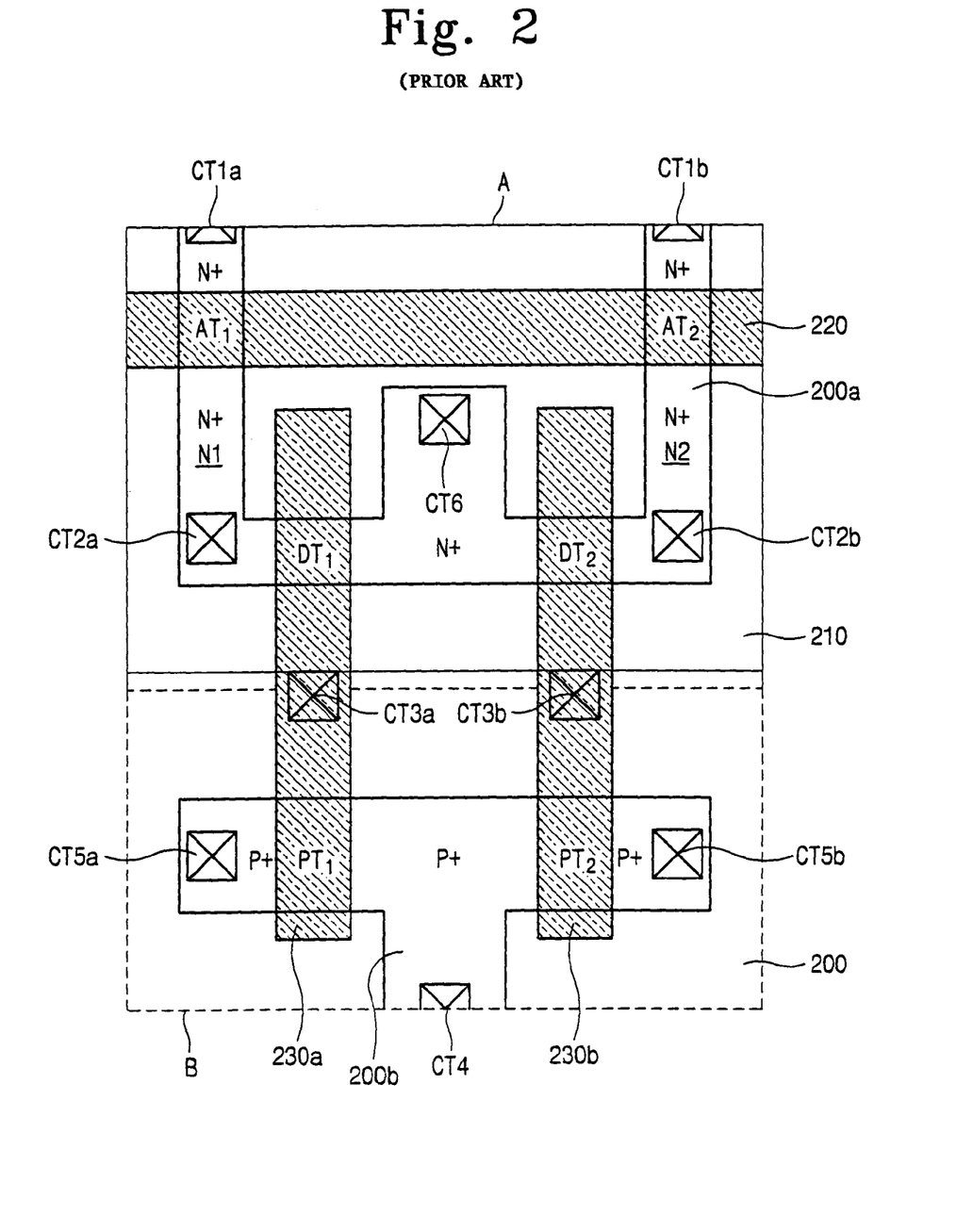
FIG. 2 is a top plan view of a conventional SRAM memory cell.

FIG. 2 is a top plan view of a conventional SRAM cell. As seen in FIG. 2, a field region 210 is formed at a substrate to define first and second active regions 200a and 200b. An N+ n-type active region is formed by heavily doping n-type impurities into a region denoted by "A", and a P+ p-type active region is formed by heavily doping p-type impurities into a region denoted by "B".

The word line 220 crosses over the active region 200a to form gates of the transistors $AT_1$ and $AT_2$. A first gate electrode 230a is disposed at right angles to the word line 220, and crosses over the active regions 200a and 200b to form gates of the transistors $DT_1$ and $PT_1$ and to connect the gates. A second gate electrode 230b is disposed in parallel with the first gate electrode 230a, that form gates of the transistors $DT_2$ and $PT_2$, and connects the gates.

The n-type impurity region N+ disposed between the transistors $AT_1$ and $DT_1$ becomes the node N1. The node N1 is coupled to a local interconnection line (not shown) through a contact CT2a. The local interconnection line is coupled to a drain of the transistor $PT_1$ through a contact CT5a, and coupled to the gates of the transistors $DT_2$ and $PT_2$.

The n-type impurity region N+ disposed between the transistors $AT_2$ and $DT_2$ becomes the node N2. The node N2 is coupled to the local interconnection line (not shown) through a contact CT2b. The local interconnection line is coupled to a drain of the transistor $PT_2$ through a contact CT5b, and coupled to the gates of the transistors $DT_1$ and $PT_1$.

The contacts CT1a and CT1b connect the drains of the transistors $AT_1$ and $AT_2$ to the separate bit lines (not shown), respectively. The contact CT4 connects the source of the transistors $PT_1$ and $PT_2$ to the power line Vdd (not shown), and the contact CT6 connects the source of the transistors $DT_1$ and $DT_2$ to a ground line Vss (not shown).

As semiconductor integrated circuits have become more highly integrated and operate at higher speed with lower power, extensive techniques for forming SOI devices have been investigated. SOI typically includes forming a single crystal silicon layer on an insulation layer to enable integration of devices disposed on the silicon layer.

Figure 3:
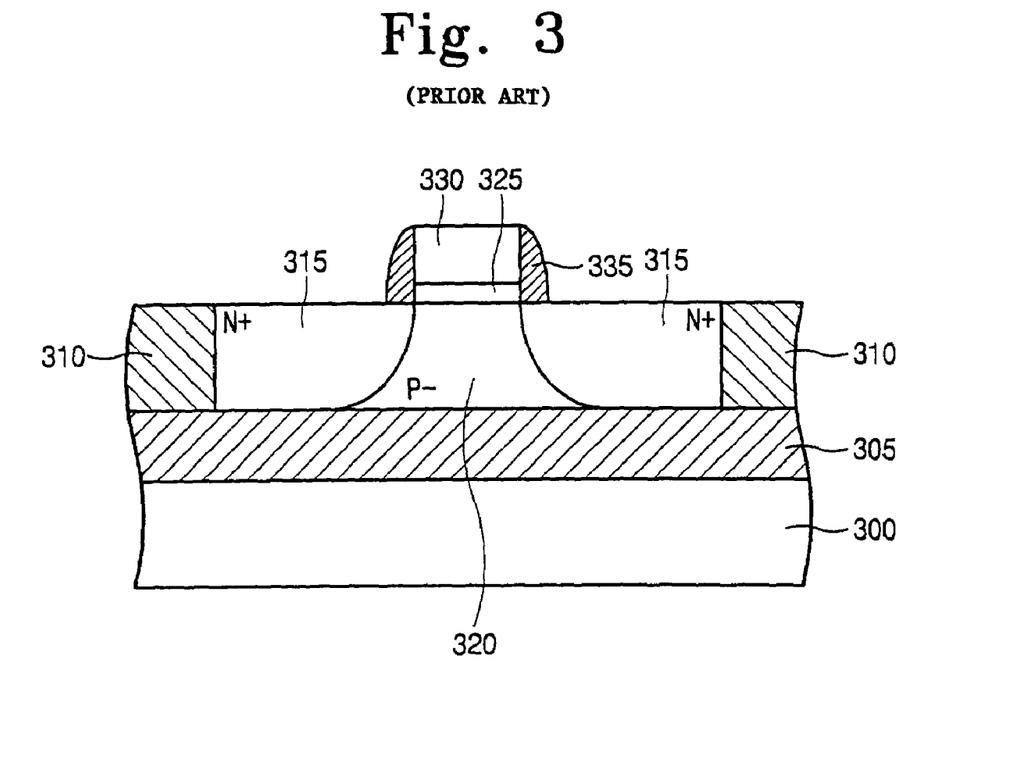
FIG. 3 is a cross-sectional view of a conventional transistor formed on a SOI substrate.

FIG. 3 is a cross-sectional view of a conventional transistor formed on a SOI substrate. Referring to FIG. 3, a buried insulation layer 305 is formed on a base substrate 300 and a p-type lightly doped semiconductor layer is formed on the buried insulation layer 305. A field region 310 is formed at the semiconductor layer to define an active region. Source and drain regions 315 are provided in the semiconductor layer. A body 320 is provided between the source and drain regions 315. A gate electrode 330 is formed on the body 320, and a gate insulation layer 325 is provided between the gate electrode 330 and the body 320. Gate spacers 335 are formed on sidewalls of the gate electrode 330.

As compared with semiconductor devices fabricated using conventional bulk wafers, SOI devices fabricated using SOI wafers may have advantages for high-speed operations due to a low junction capacitance, reduction in soft errors caused by α-particle in memory devices, and the like.

However, conventional SOI devices may suffer from floating body effects. Floating body effect may arise when the body of the device is not connected to a fixed electric potential, the body of the device has an electric potential based on its history. For example, when both source and drain regions of the transistor are at a high logic level, the body region is charged with equivalent voltages. Thereafter, when the source (or the drain) of the transistor changes quickly to a low logic level, the junction between the source (or the drain) and the body region is positively biased. As a result, a parasitic bipolar transistor may be formed that can lead to the generation of a leakage current.

Figure 4A:
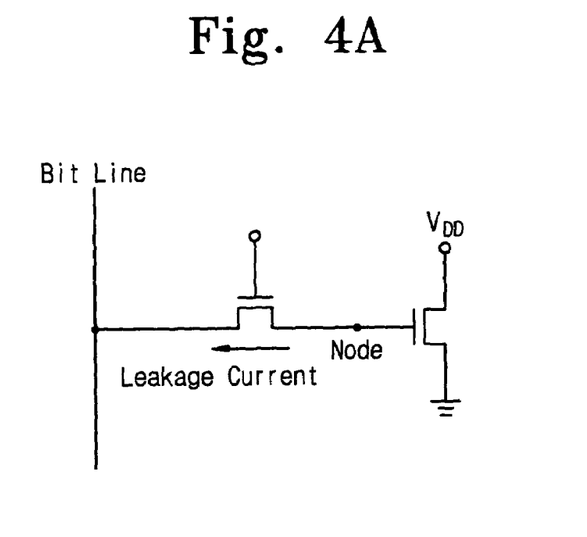
FIGS. 4A and 4B are a circuit diagram and a graph illustrating that a bipolar transistor operates to generate a leakage current in a MOS transistor.
Figure 4B:
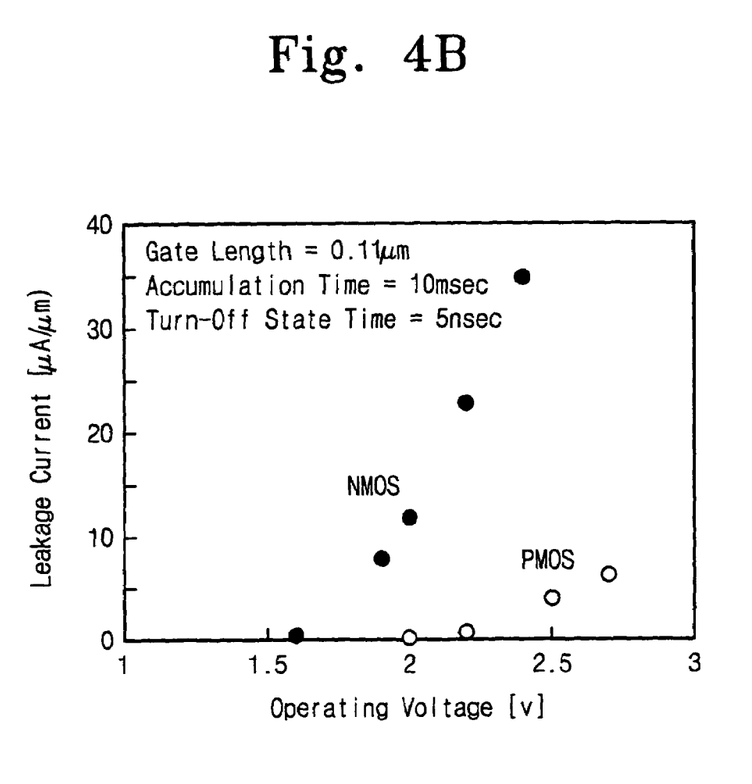

FIGS. 4A and 4B illustrate that a bipolar transistor may operate to generate a leakage current in a MOS transistor.

Referring to FIG. 4A, even if an access transistor is in the off-state, a leakage current may be generated due to floating body effect. For example, when a high signal is stored in a node, the bit line voltage may be applied at the high level for a time of approximately 1 µs to 100 ms. Thereafter, the bit line voltage is changed to a low level for a short time of approximately 1 to 10 ns. In this case, a leakage current is generated at the node toward the bit line.

Referring to FIG. 4B, a graph represents leakage current as a function of operating voltage of the bit line utilizing a length of the gate electrode of 0.11 µm, an operating voltage of the bit line was applied at a high level for a time of approximately 10 ms. Thereafter, the operating voltage of the bit line was applied at a low level for a time of 5 ns. As a result, a leakage current was generated.

SUMMARY OF THE INVENTION

Embodiments of the present invention provide a silicon on insulator (SOI) SRAM cell and methods of fabricating an SOI SRAM cell where the body of an access transistor of the SRAM cell is coupled to the source of a driver transistor of the SRAM cell. The body of the access transistor may, for example, be connected to the source of the driver transistor by a silicide layer. A body extension could also be provided and the body connected to the source of the driver transistor by a contact plug.

Particular embodiments of the present invention provide an SRAM cell formed on a SOI substrate having a base substrate, a buried insulation layer formed on the base substrate, and a semiconductor layer formed on the buried insulation layer. The SRAM cell includes a field region of the semiconductor layer that defines an active region, a word line crossing over the active region and a gate electrode crossing over the active region, the gate electrode being disposed substantially perpendicular to the word line. The SRAM cell further includes a node region of a first conductivity type in the active region between the word line and the gate electrode and a source region of the first conductivity type in the active region. The source region is adjacent the gate electrode and on an opposite side of the gate electrode from the node region. A body extension region is also provided and has a portion that is parallel to the word line and a portion that extends from the active region and connects to the source region.

In particular embodiments of the present invention, the body extension region includes a body pickup region of a second conductivity type in contact with the source region of the first conductivity type and wherein the body pickup region is disposed on a first side of the word line. In certain embodiments of the present invention, a silicide layer may be provided that connects the source region of the first conductivity type to the body pickup region of the second conductivity type. In still further embodiments of the present invention, a conductive contact plug connects the source region of the first conductivity type and the body pickup region of the second conductivity type. The conductive contact plug may also be connected to a ground line.

In some embodiments of the present invention, the width of the portion of the body extension region that is parallel to the word line is smaller than the width of the word line. Furthermore, projections may also be provided that extend from opposite sides of the word line. The projections are disposed on opposite sides of the portion of the body extension region that extends from the active region and connects to the source region.

In additional embodiments of the present invention, an SRAM cell that is formed on a silicon on insulator (SOI) substrate having a base substrate, a buried insulation layer formed on the base substrate, and a semiconductor layer formed on the buried insulation layer includes a field region of the semiconductor layer that defines first and second active regions. A word line crosses over the first active region. A first gate electrode crosses over the first and second active regions and extends substantially perpendicular to the word line. A second gate electrode crosses over the first and second active regions and extends parallel to the first gate electrode. A first node region of a first conductivity type is provided in the first active region between the word line and the first gate electrode. A second node region of the first conductivity type is provided in the first active region between the word line and the second gate electrode. A common source region of the first conductivity type is provided in the first active region between the first and second gate electrodes. A body extension region includes a portion that extends from the first active region and crosses the word line and a portion that extends parallel to the word line. The body extension region is connected to the common source region of first conductivity type.

In further embodiments of the present invention, the body extension region includes a body pickup region of a second conductivity type in contact with the common source region of first conductivity type. The body pickup region is disposed on a first side of the word line. Additionally, a silicide layer may be provided that connects the source region of the first conductivity type and the body pickup region of the second conductivity type. A conductive contact plug may also be provided that connects the source region of the first conductivity type and the body pickup region of the second conductivity type. The conductive contact plug may be connected to a ground line.

In particular embodiments of the present invention, the width of the portion of the body extension region that is parallel to the word line is smaller the width of the word line. Additionally, projections that extend from sidewalls of the word line may also be provided. Respective ones of the projections may be provided on opposite sides of the body extension region.

In still other embodiments of the present invention, the SRAM cell includes a common source region of the second conductivity type in the second active region between the first and second gate electrodes and a first drain region of the second conductivity type in the second active region that is adjacent the first gate electrode and on a side of the first gate electrode opposite the common source region of the second conductivity type. A second drain region of second conductivity type is provided in the second active region and is adjacent the second gate electrode and on a side of the second gate electrode that is opposite the common source region of the second conductivity type. A power line may also be connected to the common source line of second conductivity type. Furthermore, a first local interconnection line may be provided that connects the first node region, the first drain region of the second conductivity type and the second gate electrode. A second local interconnection line may also be provided that connects the second node region, the second drain region of the second conductivity type and the first gate electrode.

In additional embodiments of the present invention, the SRAM cell also includes a first drain region of the first conductivity type in the first active region that is adjacent the word line and on a side of the first word line opposite the first node region. A second drain region of the first conductivity type is provided in the first active region and is adjacent the word line and on a side of the word line opposite the second node region. A first bit line is connected to the first drain region of the first conductivity type and a second bit line is connected to the second drain region of the first conductivity type.

In still other embodiments of the present invention, a method for fabricating an SRAM cell on a silicon on insulator (SOI) substrate having a base substrate, a buried insulation layer formed on the base substrate, and a semiconductor layer formed on the buried insulation layer is provided by forming a field region that defines an active region of the semiconductor layer and a body extension region that extends from the active region. A word line is formed that crosses over the active region and extends parallel to the body extension region and a gate electrode formed that crosses over the active region and that extends substantially perpendicular to the word line. A node region of a first conductivity type is formed in the active region between the word line and the gate electrode using the word line, the gate electrode, and the field region as an ion implantation mask and a source region of the first conductivity type formed that connects to the body extension region in the active region and that is adjacent to the gate electrode and on a side of the gate electrode opposite the node region.

In further embodiments of the present invention, a body pickup region of a second conductivity type is formed in electrical contact with the body extension region and the source region of first conductivity type, and disposed on a first side of the word line. A silicide layer may also be formed on the source region of the first conductivity type and the body pickup region of the second conductivity type and that extends therebetween. The source region of the first conductivity type and the body pickup region of the second conductivity type may be over-etched to form a conductive contact plug and a ground line electrically connected to the conductive contact plug.

In additional embodiments, the SRAM is fabricated by doping impurities of the first conductivity type into a portion of the active region to form a drain region adjacent the word line and on a side of the word line opposite the node region and forming a bit line electrically connected to the drain region.

In still other embodiments of the present invention, a method of fabricating an SRAM cell on a silicon on insulator (SOI) substrate having a base substrate, a buried insulation layer formed on the base substrate, and a semiconductor layer formed on the buried insulation layer is provided by forming first and second active regions and a body extension region of the semiconductor layer, the body extension region being formed to extend from the first active region, forming a word line that crosses over the first active region and extends parallel to the body extension region, forming a first gate electrode that crosses over the first and second active regions and extends substantially perpendicular to the word line, forming a second gate electrode that crosses over the first and second active regions and extends parallel to the first gate electrode, forming a first node region of a first conductivity type in the first active region between the word line and the first gate electrode, forming a second node region of the first conductivity type in the first active region between the word line and the second gate electrode and forming a common source region of the first conductivity type in the first active region. The first node region, the second node region and the common source region are formed using the word line, the first and second gate electrodes, and the field region as an ion implantation mask.

DESCRIPTION OF EMBODIMENTS

The present invention will now be described more fully hereinafter with reference to the accompanying drawings, in which embodiments of the invention are shown.

Figure 5:
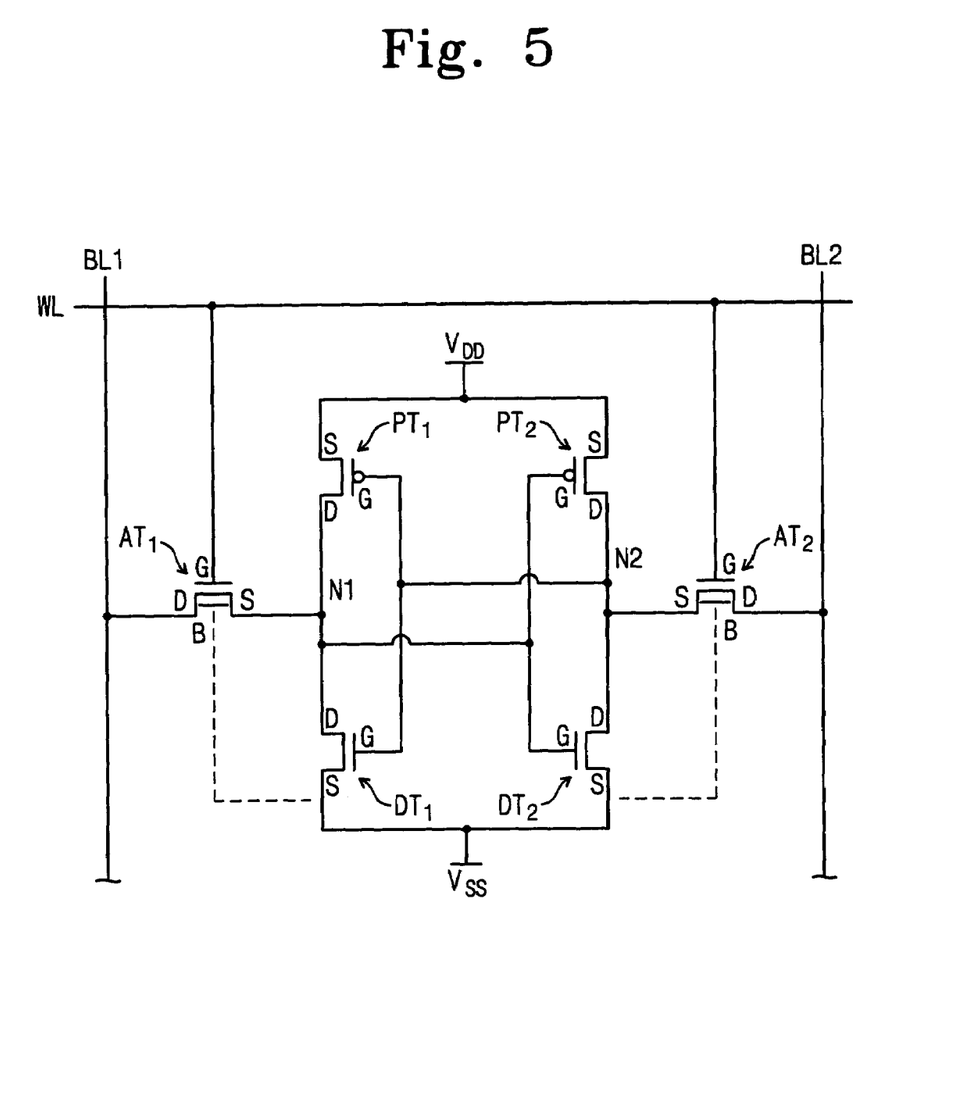
FIG. 5 is a circuit diagram of an SRAM memory cell according to embodiments of the present invention.

FIG. 5 is a circuit diagram of an SRAM cell according to embodiments of the present invention. As compared with the conventional SRAM cell illustrated in FIG. 2, in the SRAM cell illustrated in FIG. 5, the body of a transistor $AT_1$ is connected to the source of a transistor $DT_1$ and the body of a transistor $AT_2$ is connected to a source of a transistor $DT_2$. More specifically, a common source of transistors $PT_1$ and $PT_2$ is coupled to a power line Vdd. The drain of the transistor $PT_1$ is coupled to the node N1, and the drain of the transistor $PT_2$ is coupled to the node N2. The gate of the transistor $PT_1$ is connected in common to a gate of a transistor $DT_1$ and the node N2. The gate of the transistor $PT_2$ is connected in common to a gate of a transistor $DT_2$ and the node N1. The drain of the access transistor $AT_1$ is coupled to the bit line BL1, and its source is coupled to the node N1. Similarly, the drain of the access transistor $AT_2$ is coupled to the bit line BL2, and its source is coupled to the node N2. Gate electrodes of the access transistors $AT_1$ and $AT_2$ are coupled to the word line WL. The drain of the driver transistor $DT_1$ is coupled to the node N1, and its gate is, as described above, connected in common to the pull-up transistor $PT_1$ and the node N2. Likewise, the drain of a driver transistor $DT_2$ is coupled to the node N2, and its gate is connected in common to the pull-up transistor $PT_2$ and the node N1 as described above. Sources of the driver transistors $DT_1$ and $DT_2$ are connected to a ground line Vss. According to embodiments of the present invention, the body of the access transistor is coupled to the source of the driver transistor. As a result, when the body of the access transistor is floated, leakage current of a bipolar transistor may be reduced or eliminated.

FIGS. 6A to 6D are top plan views of an SRAM cell according to embodiments of the present invention. The SRAM cells are repeatedly formed symmetrically in mirror-image fashion.

Figure 6A:
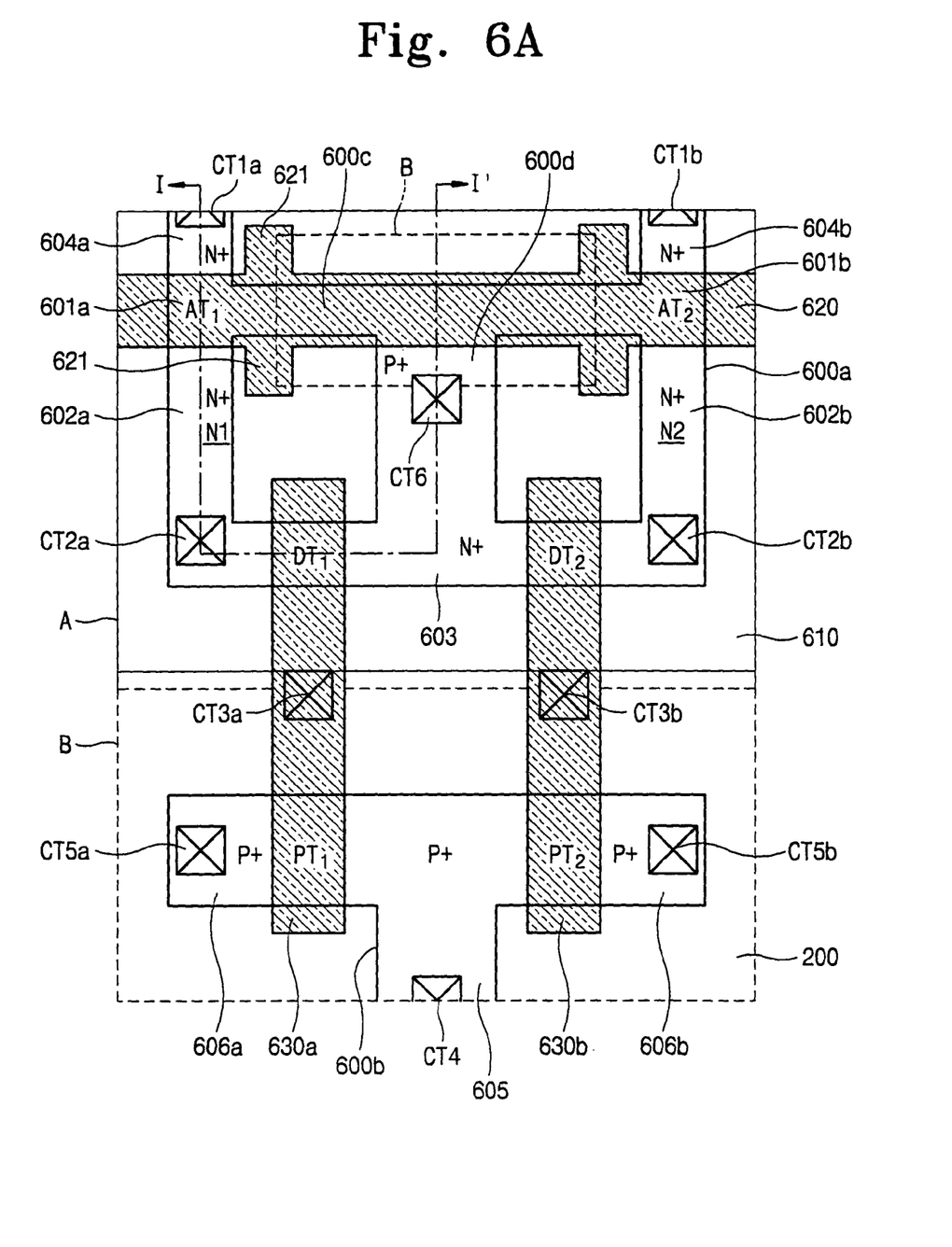
FIGS. 6A to 6C are top plan views of the SRAM memory cell according to embodiments of the present invention.

FIG. 6A is the top plan view for illustrating a field region 610, a first conductive layer, and a contact plug. Referring to FIG. 6A, the field region 610 is formed to define a first active region 600a where an n-type transistor will be formed, a second active region 600b where a p-type transistor will be formed, a body extension region 600c, and a body pickup region 600d.

First conductive layers 620, 630a, and 630b are disposed on the active region and the field region. The first conductive layers constitute a word line 620 and a gate electrode 630a and 630b. The word line 620 crosses over the first active region 600a to form gates of the transistors $AT_1$ and $AT_2$. In particular, the word line 620 has projections 621 that extend from both upper and lower sides of the word line 620, as will be described in further detail below. Also, the body extension region 600c, which is an active region parallel with the word line 620, is formed under the word line 620. The body extension region 600c connects body regions 601a and 601b of the access transistors $AT_1$ and $AT_2$, respectively, and a common source region 603 of the driver transistors $DT_1$ and $DT_2$. The width of the body extension region 600c may, in some embodiments, be smaller than that of the word line 620.

The first gate electrode 630a is disposed at right angles to the word line 620, and crosses over the active regions 600a and 600b to form gates of the transistors $DT_1$ and $PT_1$ and to connect the gates. The second gate electrode 630b is disposed in parallel with the first gate electrode 630a, and crosses over the active regions 600a and 600b to form gates of the transistors $DT_2$ and $PT_2$ and to connect the gates.

After the first conductive layers are formed, impurities are doped into the active regions 600a, 600b, and 600d using the first conductive layers 620, 630a, and 630b as well as the field region 610 as an ion implantation mask. An n-type active region N+ is formed by heavily doping n-type impurities into a region denoted by reference numeral "A". A p-type active region P+ is formed by heavily doping p-type impurities into a region denoted by reference numeral "B".

The n-type active region N+ includes a first node region 602a (N1) between the word line 620 and the first gate electrode 630a, a second node region 602b (N2) between the word line 620 and the second gate electrode 630b, the common source region 603 of the transistors $DT_1$ and $DT_2$ between the first and second gate electrodes 630a and 630b, a first drain region 604a of the transistor $AT_1$, which is adjacent to the word line 620 and disposed opposite the first node region N1, and a second drain region 604b of the transistor $AT_2$, which is adjacent to the word line 620 and disposed opposite second node region N2.

The p-type active region P+ includes a common source region 605 of the transistors $PT_1$ and $PT_2$ between the first and second gate electrodes 630a and 630b, a first drain region 606a of the transistor $PT_1$, which is adjacent to the first gate electrode 630a and disposed opposite the common source region 605, and a second drain region 606b of the transistor $PT_2$, which is adjacent to the second gate electrode 630b and disposed opposite the common source region 605. In particular, as compared with the conventional SRAM, the SRAM cell embodiments of the present invention further comprise the body pickup region 600d, which is a p-type impurity region connected to the body extension region 600c.

According to embodiments of the present invention, the body regions 601a and 601b of the access transistors $AT_1$ and $AT_2$ are to be electrically connected to the common source region 603 of the driver transistor $DT_1$ and $DT_2$. Unfortunately, there exists an undesired PN junction between the body pickup region 600d connected to the body extension region 600c and the common source region 603 of the driver transistors $DT_1$ and $DT_2$. That is, the PN junction is formed between the n-type common source region 603 (N+) and the p-type body pickup region 600d (P+) connected to the body extension region 600c. The PN junction acts as a barrier inhibiting a current path of the body pickup region 600d, which is connected to the body regions 601a and 601b of the access transistors, to the common source region 603. Consequently, because the current path is formed at a threshold voltage or higher, an additional process may be need to form the current path without the barrier, as described later.

An interlayer dielectric layer (ILD) is blanket formed on the surface of the substrate including the first conductive layers 620, 630a, and 630b. A conductive contact plug (hereinafter inclusively referred to as a "contact") is formed to penetrate the ILD. The contact includes a contact CT1a formed in the first drain region 604a of the transistor $AT_1$, a contact CT1b formed in the second drain region 604b of the transistor $AT_2$, a contact CT2a formed in the first node region 602a (N1), a contact CT2b formed in the second node region 602b (N2), a contact CT3a formed in the region of the first gate electrode 630a, a contact CT3b formed in the region of the second gate electrode 630b, a contact CT4 formed in the common source region 605 of the transistors $PT_1$ and $PT_2$, a contact CT5a formed in the first drain region 606a of the transistor $PT_1$, a contact CT5b formed in the second drain region 606b of the transistor $PT_2$, and a contact CT6 formed in the common source region 603 of the transistors $DT_1$ and $DT_2$.

Figure 6B:
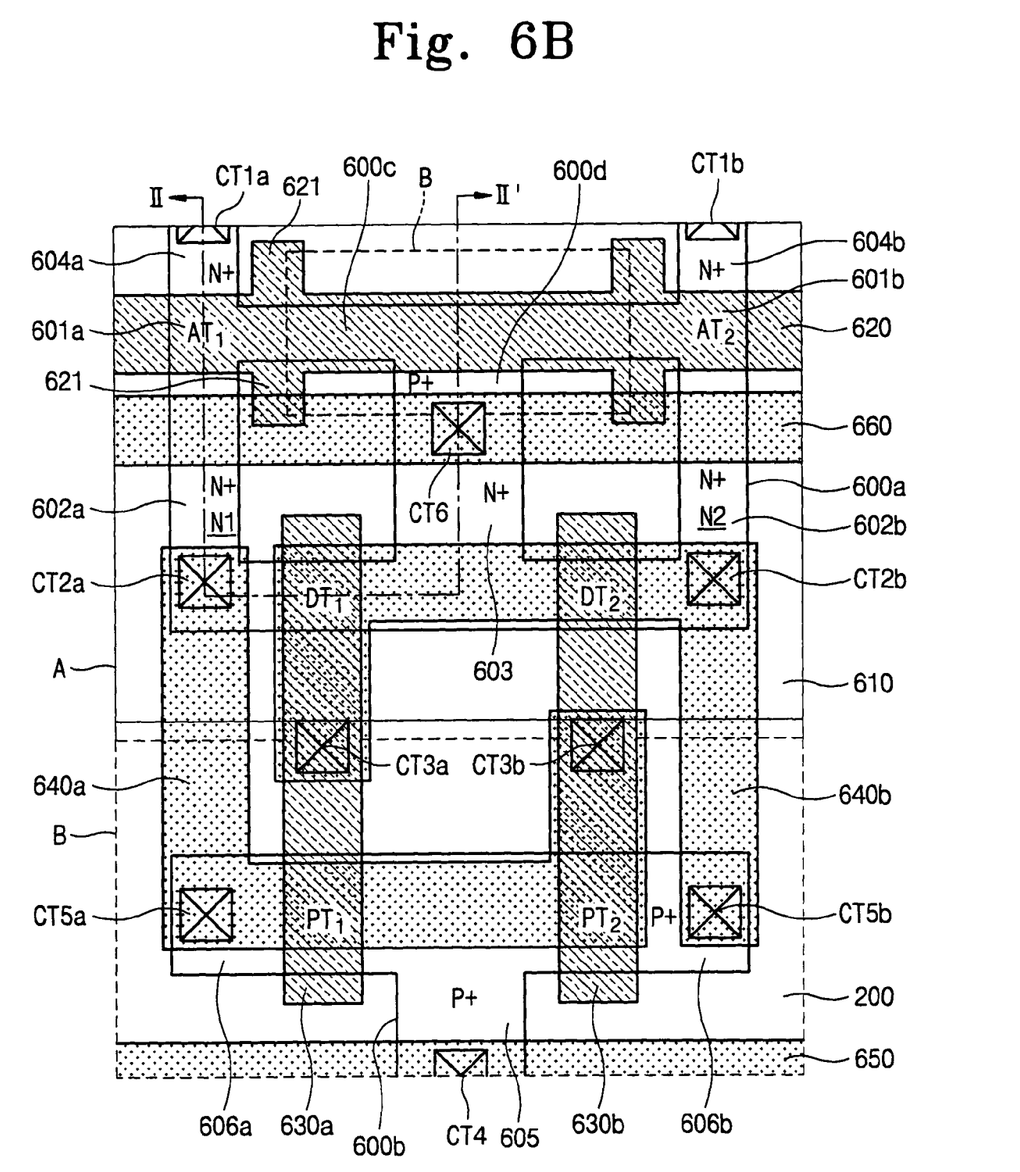

FIG. 6B is a top plan view for illustrating second conductive layers 640a, 640b, 650, and 660 on FIG. 6A. The second conductive layers constitute local interconnection lines 640a and 640b, a power line Vdd 650, and a ground line Vss 660.

Referring to FIGS. 6A and 6B, the first local interconnection line 640a is coupled to the first node region 602a (N1) through the contact CT2a, coupled to the first drain region 606a of the transistor $PT_1$ through the contact CT5a, and coupled to the gate electrode 630b of the transistors $DT_2$ and $PT_2$ through the contact CT3b. Similarly, the second local interconnection line 640b is coupled to the second node region 602b (N2) through the contact CT2b, coupled to the second drain region 606b of the transistor $PT_2$ through the contact CT5b, and coupled to the gate electrode 630a of the transistors $DT_1$ and $PT_1$ through the contact CT3a. The power line Vdd 650 connects the common source region of the transistors $PT_1$ and $PT_2$ to a power voltage through the contact CT4. The ground line Vss 660 connects the common source region of the transistors $DT_1$ and $DT_2$ to a ground through the contact CT6.

Figure 6C:
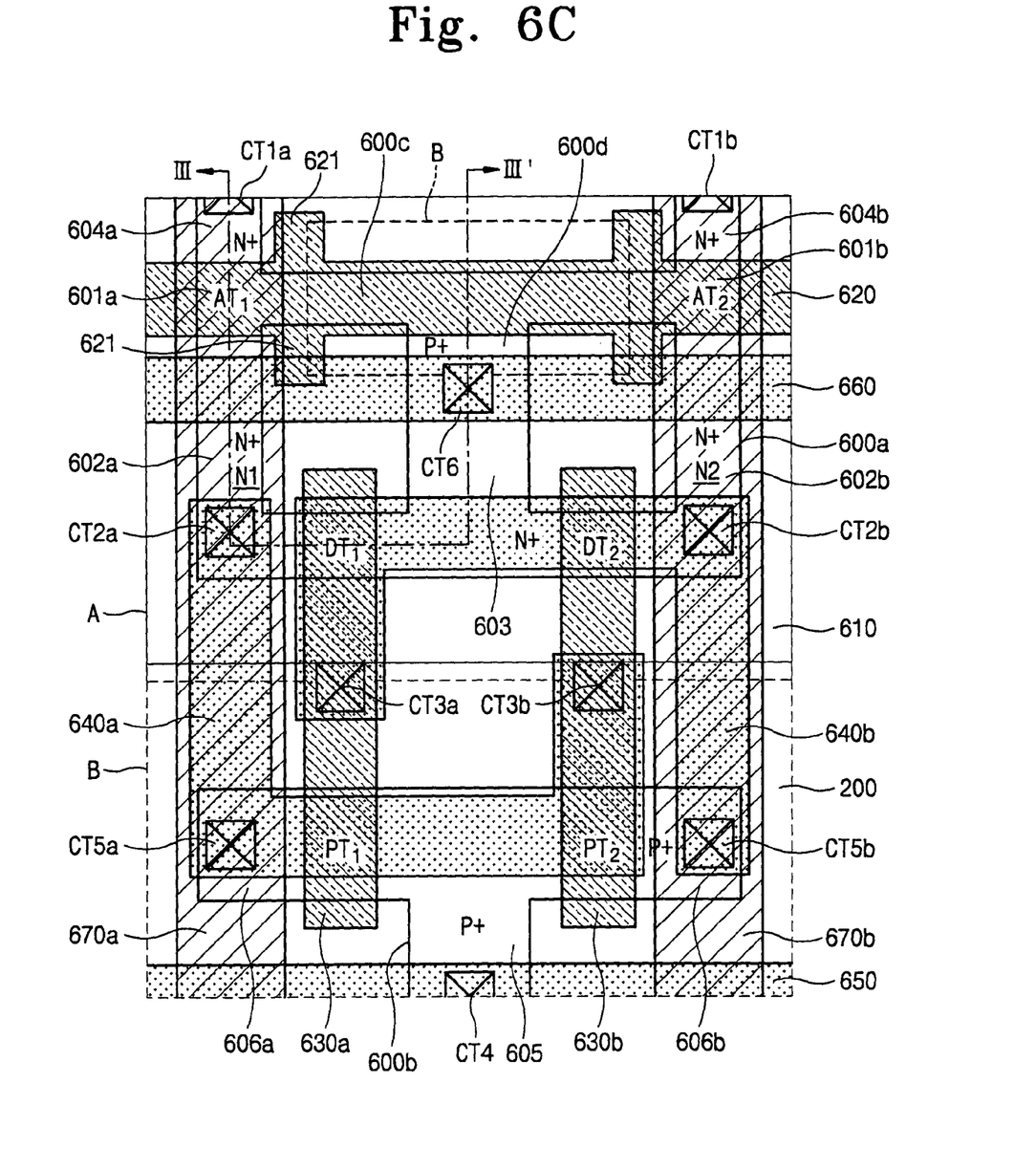

FIG. 6C is a top plan view for illustrating third conductive layers on FIG. 6B. The third conductive layers constitute bit lines 670a and 670b.

Referring to FIGS. 6A, 6B, and 6C, the first bit line 670a connects the first drain region 604a of the transistor $AT_1$ to a first bit line through the contact CT1a. Likewise, the second bit line 670b connects the second drain region 604b of the transistor $AT_2$ to a second bit line through the contact CT1b.

Figure 7A:
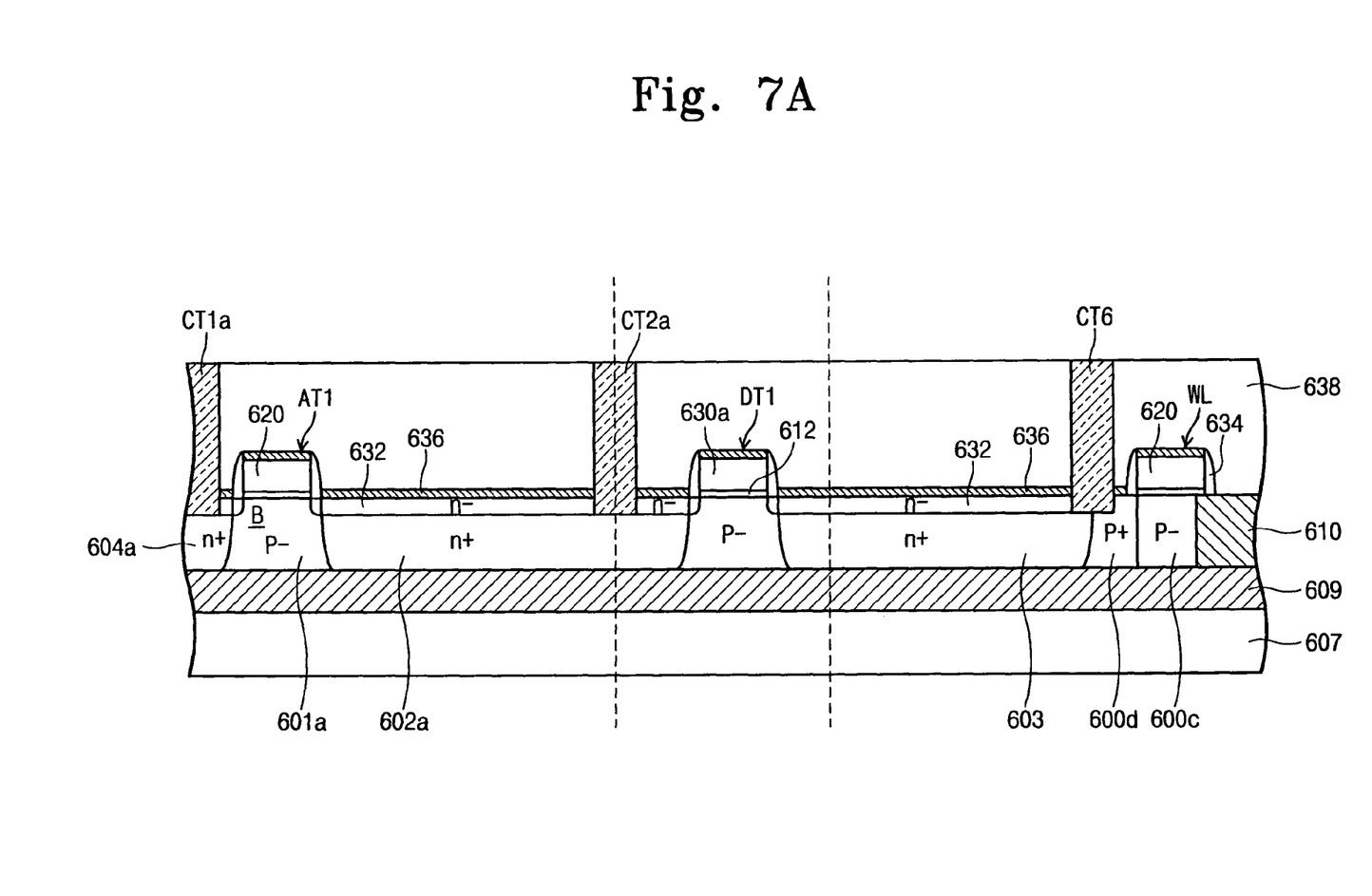
FIG. 7A is a cross-sectional view taken along a line I–I' of FIG. 6A.
Figure 7B:
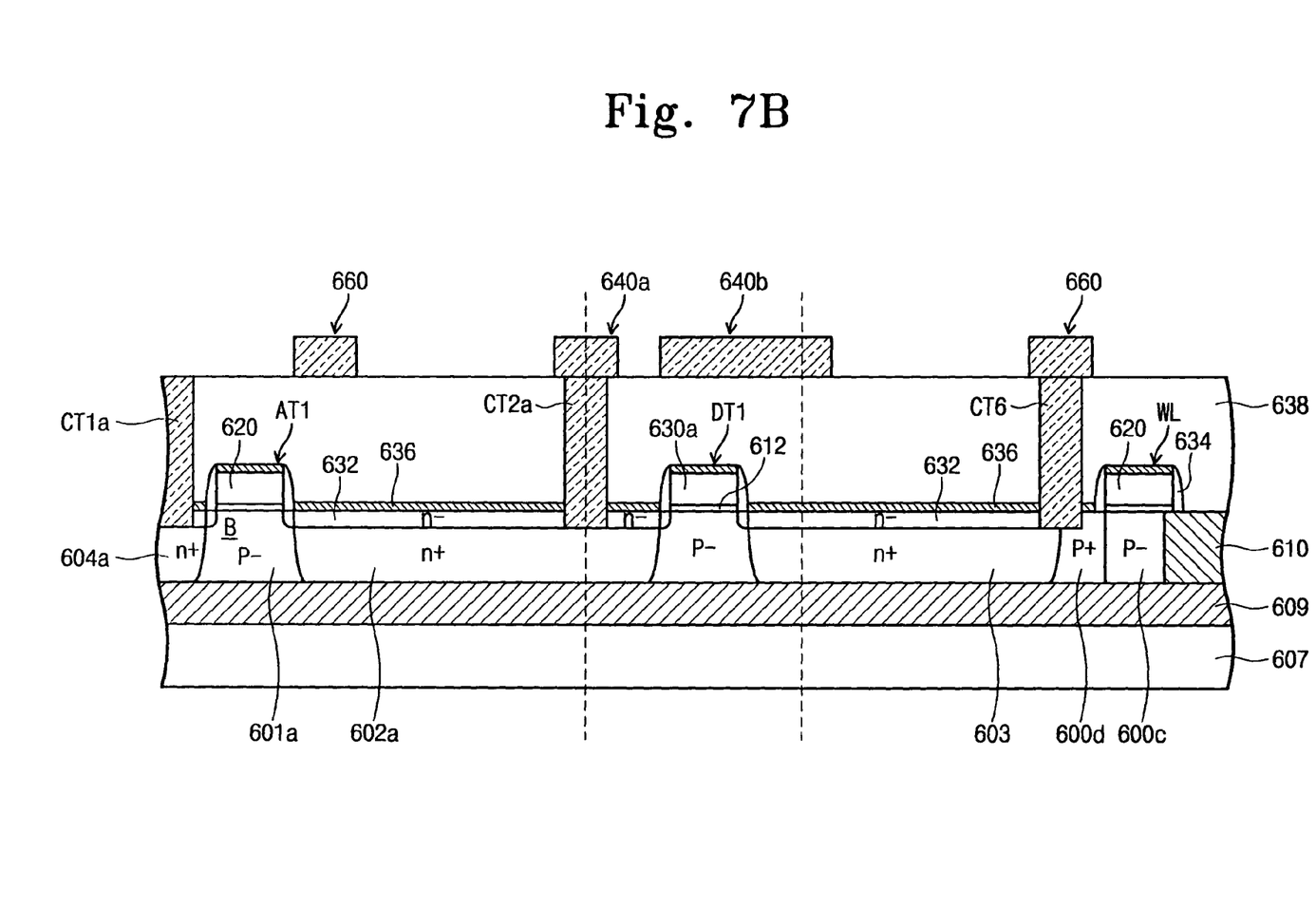
FIG. 7B is a cross-sectional view taken along a line II–II' of FIG. 6B.
Figure 7C:
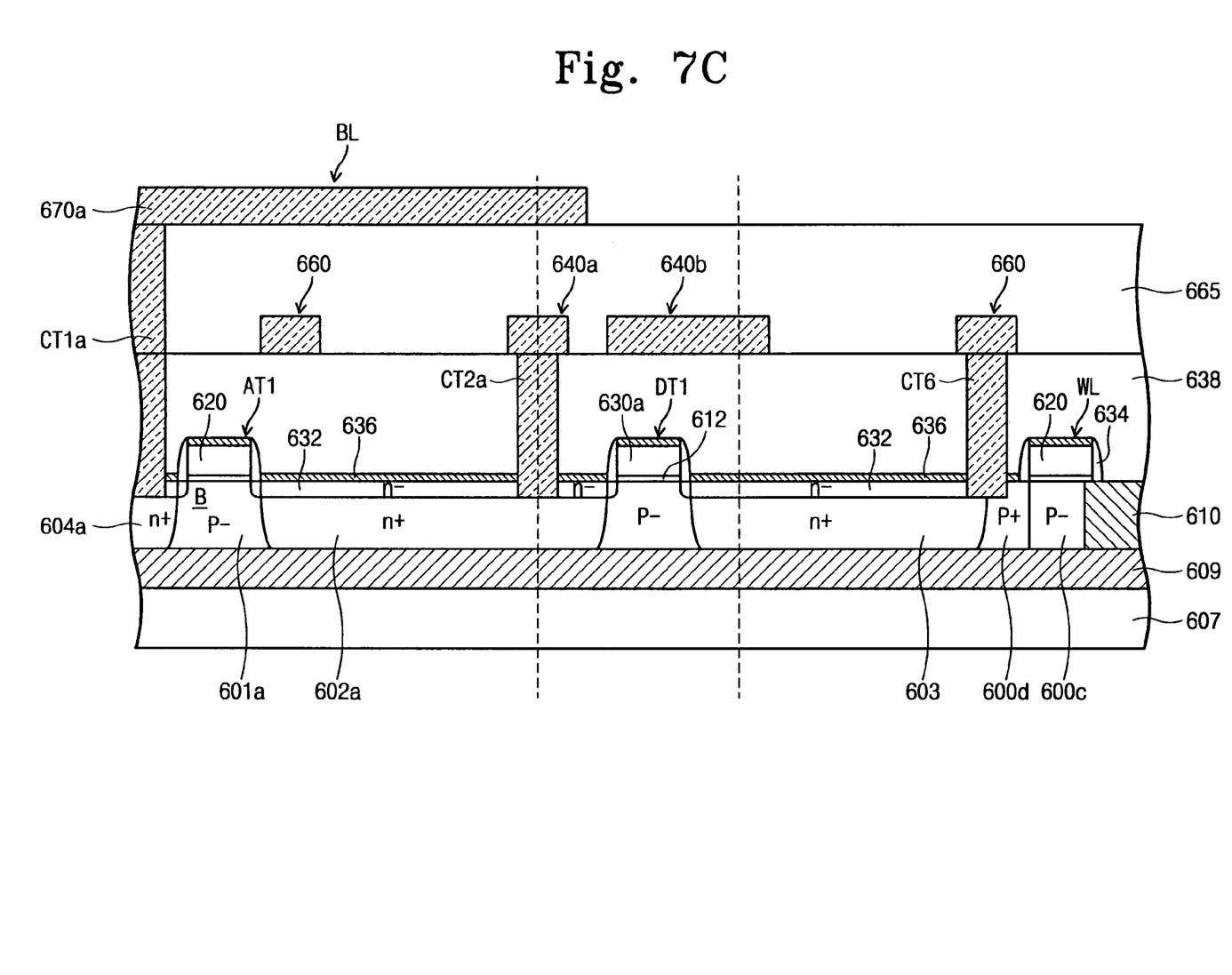
FIG. 7C is a cross-sectional view taken along a line III–III' of FIG. 6C.

FIG. 7A is a cross-sectional view taken along a line I–I' of FIG. 6A, FIG. 7B is a cross-sectional view taken along a line II–II' of FIG. 6B, and FIG. 7C is a cross-sectional view taken along a line III–III' of FIG. 6C. The cross-sectional views of FIGS. 7A to 7C are taken in the direction of the access transistor $AT_1$, the driver transistor $DT_1$, and the word line WL. The same portions as those illustrated in FIGS. 6A to 6C are represented by the same numbers. Angular points illustrated in FIGS. 6A to 6C are illustrated in dotted lines in FIGS. 7A to 7C.

Referring to FIG. 7A, after performing a process for isolating devices, a first conductive layer and a contact plug are formed at a SOI substrate.

The SOI substrate comprises a base substrate 607, a buried insulation layer 609 formed on the base substrate 607, and a p-type lightly doped semiconductor substrate formed in the buried insulation layer 609.

A field region 610 is formed on the semiconductor layer to define an active region. That is, the semiconductor layer is etched to form a trench, and the trench is sufficiently filled with an insulating material. The resultant structure is then polished by chemical mechanical polishing (CMP) to form a field region 610.

Next, a gate insulation layer 612 and first conductive layers 620 and 630a are blanket formed on the surface of the substrate, and patterned to form a word line 620, a gate electrode 620 of a transistor $AT_1$, and a gate electrode 630a of a transistor $DT_1$. The first conductive layers 620 and 630a may be composed of at least one material selected from the group consisting of doped polycide, cobalt, tungsten, titanium, nickel, tantalum, titanium nitride, tantalum nitride, and tungsten nitride.

By using the first conductive layers 620 and 630a and the field region 610 as an ion implantation mask, impurities are lightly doped into the active region to form an impurity region 632.

A gate spacer insulation layer is blanket formed on the surface of the substrate, and etched back to form a spacer 634 on sidewalls of the first conductive layers 620 and 630a.

Thereafter, impurities are heavily doped by using a photoresist pattern (not shown) as an ion implantation mask to form n-type active regions 602a, 603, and 604a. The n-type active regions include a first node region 602a, a source region 603 of the transistor $DT_1$, and a first drain region 604a of the transistor $AT_1$ as illustrated in FIG. 7A.

Next, impurities are heavily doped by using a photoresist pattern (not shown) as an ion implantation mask to form a p-type body pickup region 600d. Referring to FIGS. 6A and 7A, a body region 601a of the access transistor $AT_1$ is connected to the p-type heavily doped body pickup region 600d through a body extension region 600c formed under the word line 620 (WL). The p-type body pickup region 600d forms a PN junction together with the common source region 603 of the already formed transistor $DT_1$. As described above, since the junction has a threshold voltage, it is required to form a current path without any barrier.

The substrate is silicided to form a suicide layer 636. After depositing a material selected from the group consisting of Ti, Co, and Ni on the substrate, a thermal process may be performed on the substrate by rapid thermal annealing (RTP) or annealing using a furnace. As a result of the thermal process, while the metal formed on the spacer 634 is not silicided, the metal formed on the active regions 602a, 603, and 604a as well as the first conductive layers 620 and 630a are silicided together with the active regions and the first conductive layers. This forms silicide, such a one of $TiSi_2$, $CoSi_2$, or $NiSi_2$. A cleaning process is performed using a mixed solution of $H_2SO_4$ and $H_2O_2$ on the semiconductor substrate when the thermal process is complete, thereby removing the non-silicided metal. Because the suicide 636 has a low resistance, the silicide 636 may improve the speed of device. Furthermore, the suicide 636 may enable a current path without the barrier of the threshold voltage of the PN diode.

An ILD 638 is blanket formed on a surface of the substrate, and the resultant structure is planarized. A contact hole is then formed to penetrate the ILD 638 and connect to the active region of the semiconductor substrate. Contacts CT1a, CT2a, and CT6 are composed of conductive materials. When the contact hole is formed, the PN diode region may be over-etched and the contact hole is filled with conductive materials. As a result, the contact CT6 may providea a current path without the PN diode.

Referring to FIG. 7B, second conductive layers 640a, 640b, and 660 are blanket formed on a surface of the substrate including the contacts, and patterned to form a ground line 660 and local interconnection lines 640a and 640b.

Referring to FIG. 7C, a second ILD 665 is blanket formed on an entire surface of the substrate including the second conductive layers 640a, 640b, and 660 and a contact CT1a formed. A third conductive layer is blanket formed on a surface of the substrate, including the contact CT1a, and patterned to form a first bit line 670a.

Figure 8A:
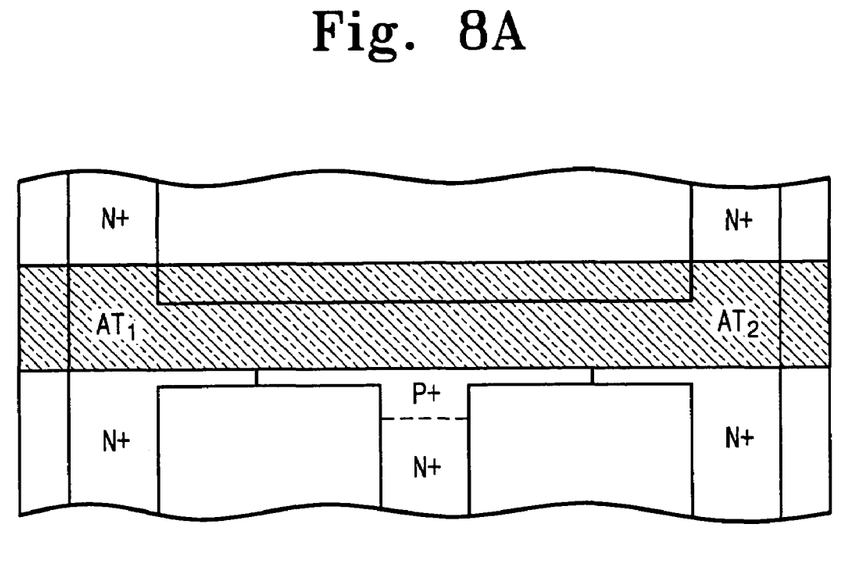
FIGS. 8A and 8B are partial top plan views for illustrating formation of a cross-shaped projection on a word line in embodiments of the present invention.
Figure 8B:
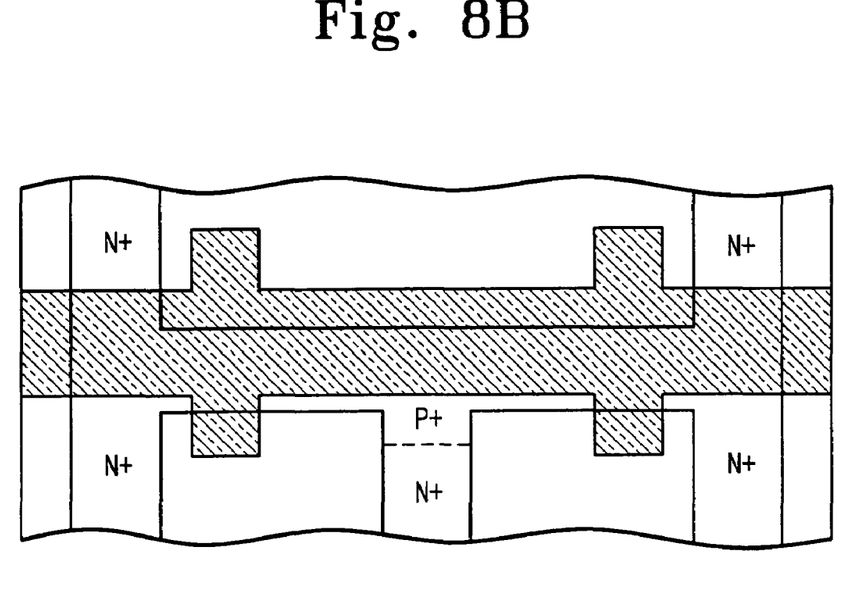

FIGS. 8A and 8B are partial top plan views illustrating the reason for formation of a cross-shaped projection on a word line. FIG. 8A is a top plan view showing that, when the word line is formed into a straight line, the word line may move upward due to misalignment. In the event that the misalignment of the word line leads to connection between the active regions, a current path may be formed during subsequent silicidation processes. This may cause an increase in a leakage current. To prevent the misalignment, a width of the word line may be extended, but this may not be preferable because it may reduce the level of integration of the devices.

FIG. 8B is a top plan view showing that, when projections extended from both sidewalls of the word line are formed, and the foregoing misalignment is generated to move the word line upward, the projections formed under the word line may prevent a leakage current. Similarly, in the case that the misalignment is generated to move the word line downward, leakage current may be prevented by projections formed on an upper part of the word line.

According to embodiments of the present invention as described above, in an SRAM cell formed on a SOI substrate, a body region of an access transistor can be connected to a source of a driver transistor through a body extension region, which is extended from an active region. As a result, floating body effect can be reduced or eliminated.

In addition, in certain embodiments of the present invention, the body extension region is formed under a word line. Consequently, the body of the access transistor can be connected to the source of the driver transistor without increasing the area of the cell.

The invention may be embodied in different forms and should not be construed as limited to the embodiments set forth herein. Rather, these embodiments are provided so that this disclosure will be thorough and complete, and will fully convey the scope of the invention to those skilled in the art.

What is claimed is:

1. A static random access memory (SRAM) cell, comprising:
    a semiconductor-on-insulator (SOI) substrate;
    a first inverter having a first pull-up transistor and a first pull-down driver transistor therein;
    a first access transistor having a gate terminal electrically connected to a word line, a source region electrically connected to an input of said first inverter and a body region of second conductivity type;
    a body extension region of second conductivity type that extends in said semiconductor substrate, forms a non-rectifying junction with the body region of said first access transistor;
    a body pickup region of second conductivity type that extends in said semiconductor substrate, forms a non-rectifying junction with said body extension region and forms a P-N rectifying junction with a source region of first conductivity type within the first pull-down driver transistor; and a contact that extends on a surface of said substrate and forms an electrical short to said body pickup region and the source region of the first pull-down driver transistor.

2. The SRAM cell of claim 1, further comprising:
a second inverter having a second pull-up transistor and a second pull-down driver transistor therein; and
a second access transistor having a gate terminal electrically connected to the word line, a source region electrically connected to an input of said second inverter and a body region of second conductivity type electrically shorted to a source region of first conductivity type within the second pull-down driver transistor.

3. The SRAM cell of claim 1, wherein the word line is disposed over the body extension region, and the body extension region is parallel to the word line.

4. The SRAM cell of claim 1, wherein the body pickup region is disposed at one side of the word line, and the body pickup region is more highly doped than the body region of said first access transistor.

5. The SRAM cell of claim 3, wherein a width of the body extension region is smaller than a width of the word line.

6. The SRAM cell of claim 3, further comprising:
projections extended from opposite sidewalls of the word line, and the projections are disposed at opposite sides of the body extension region.

7. The SRAM cell of claim 1, further comprising:
an electrically insulating interlayer dielectric layer on the surface of said substrate, said interlayer dielectric layer having an opening there that is filled with said contact.

8. The SRAM cell of claim 2, wherein the body region of said first access transistor is electrically connected by said body extension region to the body region of said second access transistor.

9. The SRAM cell of claim 1, wherein the first conductivity type is N-type conductivity and the second conductivity type is P-type conductivity.

10. The SRAM cell of claim 1, further comprising:
a silicide layer on the source region of the first pull-down driver transistor and on the body pickup region.

11. The SRAM cell of claim 10, wherein the contact goes through the silicide layer.

12. A static random access memory (SRAM) cell, comprising:
a semiconductor-on-insulator (SOI) substrate;
a first inverter having a first pull-up transistor and a first pull-down driver transistor therein;
a first access transistor having a gate terminal electrically connected to a word line, a source region electrically connected to an input of said first inverter and a body region of second conductivity type;
a body extension region of second conductivity type that extends in said semiconductor substrate, forms a non-rectifying junction with the body region of said first access transistor;
a body pickup region of second conductivity type that extends in said semiconductor substrate, forms a non-rectifying junction with said body extension region and forms a P-N rectifying junction with a source region of first conductivity type within the first pull-down driver transistor; and
a silicide layer disposed on a surface of said substrate and forms an electrical short to said body pickup region and the source region of the first pull-down driver transistor.

13. The SRAM cell of claim 12, further comprising:
a second inverter having a second pull-up transistor and a second pull-down driver transistor therein; and
a second access transistor having a gate terminal electrically connected to the word line, a source region electrically connected to an input of said second inverter and a body region of second conductivity type electrically shorted to a source region of first conductivity type within the second pull-down driver transistor.

14. The SRAM cell of claim 13, wherein the body region of said first access transistor is electrically connected by said body extension region to the body region of said second access transistor.

15. The SRAM cell of claim 12, wherein the word line is disposed over the body extension region, and the body extension region is parallel to the word line.

16. The SRAM cell of claim 15, wherein a width of the body extension region is smaller than a width of the word line.

17. The SRAM cell of claim 15, further comprising:
projections extended from opposite sidewalls of the word line, and the projections are disposed at opposite sides of the body extension region.

18. The SRAM cell of claim 12, wherein the body pickup region is disposed at one side of the word line, and the body pickup region is more highly doped than the body region of said first access transistor.

* * * * *